United States Patent [19]
Hanson et al.

[11] Patent Number: 5,696,422
[45] Date of Patent: Dec. 9, 1997

[54] CRYSTAL PACKAGE

[75] Inventors: William P. Hanson; Timothy E. Wickard; Charles Jensik, all of Carlisle, Pa.

[73] Assignee: Piezo Crystal Company, Carlisle, Pa.

[21] Appl. No.: 609,529

[22] Filed: Mar. 1, 1996

[51] Int. Cl.⁶ ..................................... H01L 41/08
[52] U.S. Cl. .................. 310/344; 310/353; 310/366
[58] Field of Search .................... 310/344, 348, 310/351–353

[56] References Cited

U.S. PATENT DOCUMENTS

| | | | |
|---|---|---|---|
| 2,954,490 | 9/1960 | Warner, Jr. | 310/344 |
| 3,735,166 | 5/1973 | Bradley | 310/344 |
| 3,931,388 | 1/1976 | Hafner et al. | 310/344 |
| 4,127,840 | 11/1978 | House | 338/4 |
| 4,266,156 | 5/1981 | Kizaki | 310/344 |
| 4,266,157 | 5/1981 | Peters | 310/353 |
| 4,293,986 | 10/1981 | Kobayashi et al. | 310/344 X |
| 4,354,130 | 10/1982 | Ono et al. | 310/313 A |
| 4,453,104 | 6/1984 | Rapps et al. | 310/348 |
| 4,524,497 | 6/1985 | Rapps et al. | 29/25.35 |
| 4,748,367 | 5/1988 | Bloch et al. | 310/353 X |
| 4,750,246 | 6/1988 | Pollard | 310/344 X |
| 4,985,655 | 1/1991 | Jensik et al. | 310/344 |
| 5,041,800 | 8/1991 | Long et al. | 331/69 |
| 5,382,929 | 1/1995 | Inao et al. | 310/344 X |
| 5,430,345 | 7/1995 | Takahashi | 310/348 |
| 5,585,687 | 12/1996 | Wakabayashi et al. | 310/366 |

FOREIGN PATENT DOCUMENTS 2012479  7/1979  United Kingdom.

*Primary Examiner*—Mark O. Budd
*Attorney, Agent, or Firm*—Buchanan Ingersoll, P.C.

[57] ABSTRACT

The invention provides for a package for holding a crystal. The package preferably includes a ceramic base, ceramic top member and a plurality of metallization bands. The ceramic base and the ceramic top member may be cofired to seal the first portion of each of the metallization bands therein. The package additionally includes a seal ring engageable with the ceramic top member and a housing engageable with the seal ring to define a sealed crystal chamber. A plurality of ribbon bands are provided within the crystal chamber to electrically couple the metallization bands with the crystal. The crystal package may include an integrated circuit chip for providing an oscillator and a heating element for maintaining constant temperature.

23 Claims, 4 Drawing Sheets

CRYSTAL PACKAGE

BACKGROUND OF THE INVENTION

1. Field of the Invention

The present invention relates to structures for holding crystal resonators, and more particularly to a hermetically sealed crystal header package having a ceramic substrate.

2. Description of the Related Art

In general, piezoelectric crystal devices may be used for frequency control, timing, transducers, delay lines and other applications. The piezoelectric material utilized for a majority of the applications is quartz. When utilized as a crystal, quartz acts as a stable mechanical resonator.

Wafers are usually cut from a mother crystal to fabricate quartz resonators. The wafers are precisely cut with respect to crystallographic axes and shaped to required dimensions. Precision quartz resonators must be manufactured with exacting tolerances to meet very low aging rates, have minimum phase noise and maximum Q.

The quartz wafer is mounted in a holder structure or crystal package for use within electronic devices. Electrodes may be applied to the wafer to provide electrical connection to the resonator within the crystal package. The crystal resonator is preferably hermetically sealed inasmuch as the performance of the quartz resonator may be limited by the leak rate and mounting stress of the crystal package. In particular, the presence of contaminants within crystal package may impair the efficiency of the crystal operation and detract from the crystal's quality and reliability. Therefore, leakage of contaminants should be kept to a minimum. Hermetically sealed crystal packages may additionally be utilized in many different environments.

It is also important to provide multiple electrical connections to the surfaces of the wafer without flexing or repositioning the crystal wafer. Space limitations have become increasingly stringent while the demand for additional mechanical and electrical contact points with the wafer have also increased.

Conventional devices attempt to seal the interface between the outer housing and the terminals which are attached to the crystal wafer. For example, the terminals in some conventional crystal packages are hermetically sealed in an eyelet to form a header and the header is hermetically sealed to a metal or glass container which contains the crystal wafer. A first vitreous material, generally an iron-nickel-cobalt alloy such as KOVAR, may be utilized in glass headers to fabricate the terminals and eyelets. A second vitreous material, such as glass or an equivalent thereof, having the same thermal coefficient of expansion as the first vitreous material may be utilized to seal the terminals to the eyelet.

While the aforementioned conventional devices may initially provide sufficiently low leakage, it is not uncommon for either the glass to metal interface or the ceramic to metal interface to separate and leak. This separation and leakage degrades the aging, phase noise, Q and resistance of the crystal resonator. Further, the leads of the crystal resonator are usually bent and cut during installation of the resonator which exacerbates the separation of the interfaces.

The crystal header package taught in U.S. Pat. No. 4,985,655 utilizes a sapphire disk-shaped base mounted to a metallic housing with a KOVAR ring mounted therebetween. The sapphire base includes a plurality of metallized apertures positioned in a bulk acoustic wave and lateral field terminal arrangement. Each of the apertures contains a terminal to provide electrical connection to the quartz crystal wafer within the metallic housing. A sapphire base and KOVAR ring where utilized to minimize leakage.

The sapphire base within such a conventional crystal package must have a certain thickness in order to provide a sufficient bond surface area with the terminals passing therethrough to minimize leakage. However, the utilization of a thick sapphire base results in a crystal header package with increased size and such a crystal package may not be useable in many applications where the limitations upon space are great.

Therefore, there is a need for a compact crystal package that has an extremely low leakage rate of contaminants.

SUMMARY OF THE INVENTION

The invention provides for a compact package for holding a crystal. The package preferably includes a ceramic base having an upper surface and a lower surface and a plurality of metallization bands each having a first portion adjacent the upper surface of the ceramic base and a second portion adjacent the lower surface of the ceramic base. The metallization bands additionally include an intermediate portion adjacent the perimeter of the ceramic base for electrically coupling the first portion with the second portion of a respective metallization band. The perimeter of the ceramic base preferably includes a plurality of castillations which are configured to receive the intermediate portions of the metallization bands.

The package in accordance with the present invention additionally includes a ceramic top member attached to the upper surface of the ceramic base. The ceramic base and the ceramic top member seal the first portion of each of the metallization bands therein. Preferably, the ceramic base and ceramic top member are cofired together.

The package in accordance with the present invention also includes a seal ring having a first end and a second end and the first end thereof is engageable with the ceramic top member. A housing having a first end and an enclosed second end is also provided and the first end of the housing is engageable with the second end of the seal ring to define a sealed crystal chamber. The seal ring and housing may be nickel and/or gold plated and are preferably joined by cold welding.

A plurality of ribbon bands are provided within the package. Each of the ribbon bands electrically couples a respective one of the metallization bands with the resonator within the crystal chamber.

The crystal package in accordance with the present invention may further include a brazing compound intermediate the ceramic top member and the seal ring for brazing the ceramic top member and seal ring together.

The ceramic base and ceramic top member may be alumina. Alternatively, other ceramic materials, such as boron-nitride, may be utilized in specialized applications requiring improved thermal performance or other enhanced characteristics.

The crystal package may also include a plurality of leads coupled with the metallization bands to provide electrical connections to the package.

The utilization of a cofired ceramic base and ceramic top member in accordance with the present invention provides a crystal package without feedthrus. The absence of feedthrus within the base reduces a common source of leaking and reduces the presence of contaminants within the sealed crystal chamber.

The inclusion of seven electrical connections including case ground enables additional components or connections to be made in addition to the standard bulk acoustic wave resonator with two electrical connections. In particular, monolithic crystal filters, surface acoustic wave resonators, surface transverse wave resonators, lateral field resonators, thermistors, heaters, multiple crystals and the like may be mounted within the crystal package in accordance with the present invention. Furthermore, the crystal package may be manufactured in a wide range of diameters and sizes to accommodate various sized piezoelectric or electronic devices requiring a hermetic package.

The package in accordance with the present invention may additionally include: an integrated circuit chip mounted onto the base to provide an oscillator, and/or a heating element mounted onto the resonator to provide temperature stability.

A complete understanding of the invention will be obtained from the following description and the accompanying figures.

DETAILED DESCRIPTION OF SOME PREFERRED EMBODIMENTS

Figure 1:
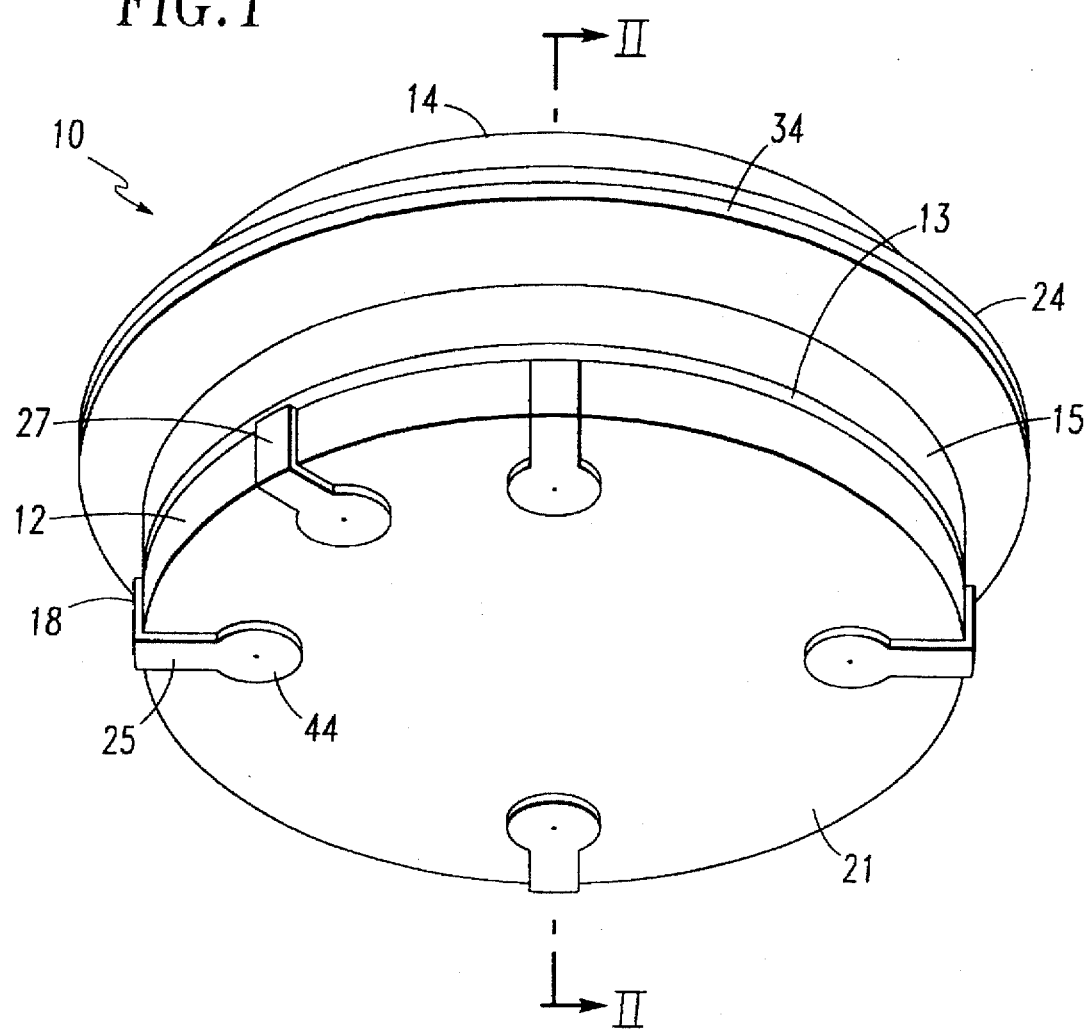
FIG. 1 is a perspective view of the crystal package in accordance with the present invention.
Figure 2:
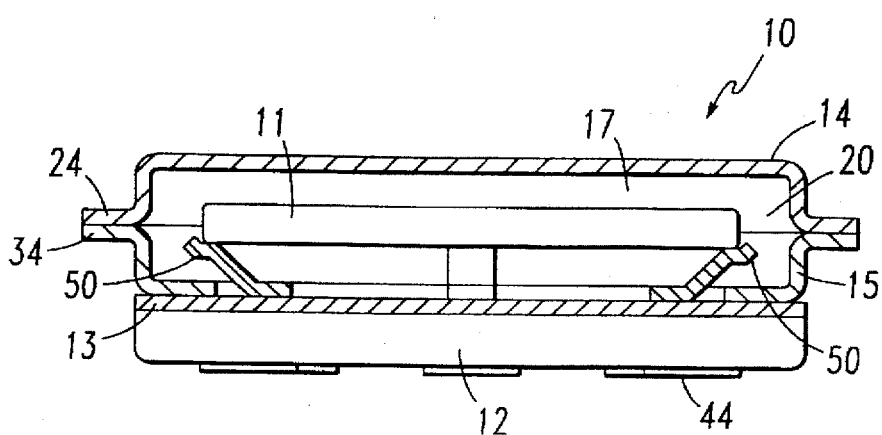
FIG. 2 is a cross-sectional view of the crystal package taken along line II—II shown in FIG. 1.

Referring to FIG. 1, an embodiment of the crystal package 10 in accordance with the present invention is shown. The crystal package 10 generally includes a ceramic base 12, ceramic top member 13, housing 14, and a seal ring 15. The resonator 11 may be provided within a sealed crystal chamber 17 defined by the housing 14, seal ring 15 and ceramic top member 13 as shown in FIG. 2.

A plurality of metallization bands 18 which may be arranged in a bulk acoustic wave and lateral field arrangement shown in FIG. 1 provide electrical connection to the resonator 11 within the crystal package 10.

Figure 3:
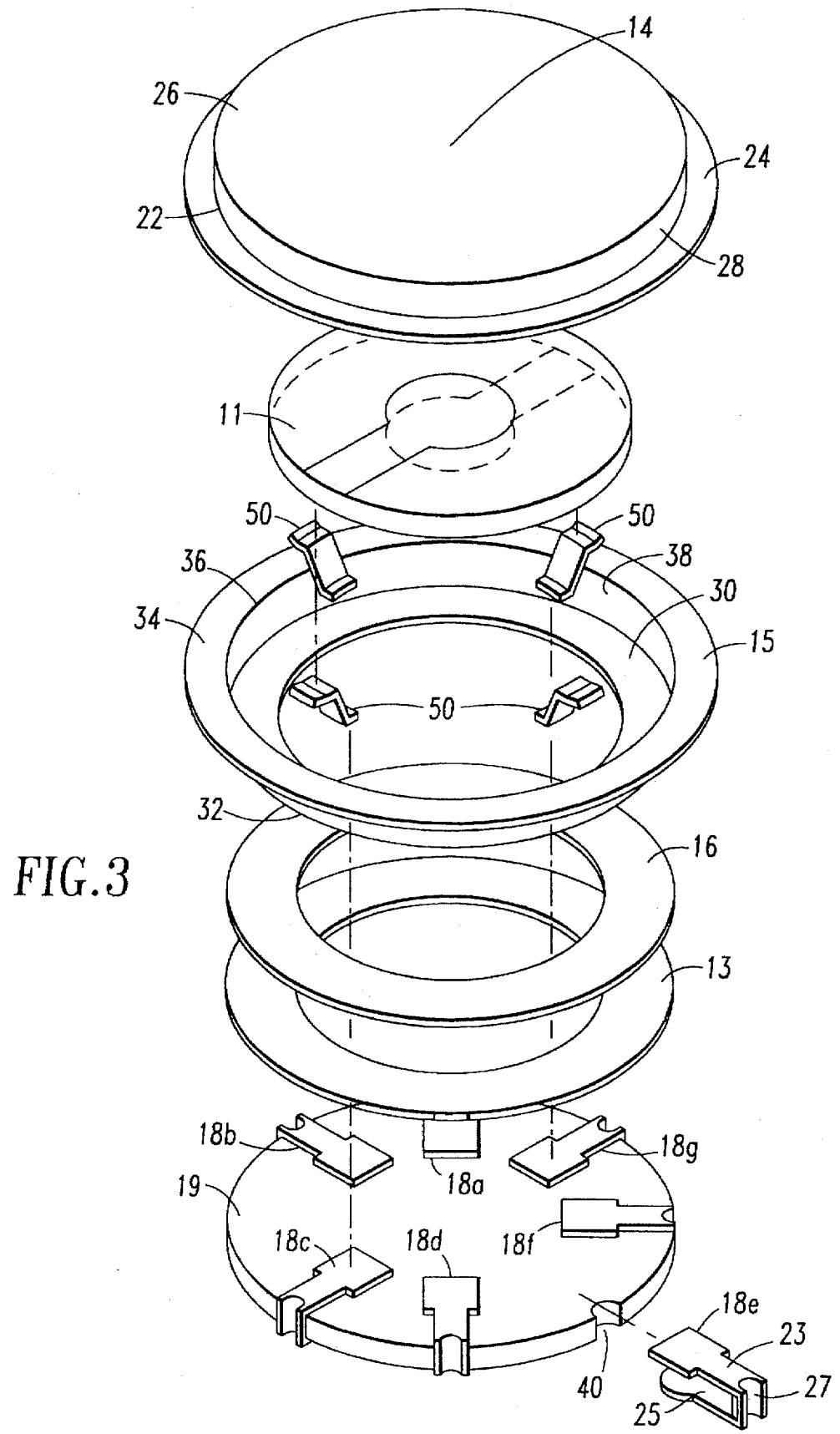
FIG. 3 is a exploded view of the crystal package in accordance with the present invention.

Alternatively, the crystal package 10 may include additional metallization bands 18 as shown in FIG. 3. The additional metallization bands 18e, 18g permit additional components such as monolithic crystal filters, surface acoustic wave resonators, surface transverse wave resonators, lateral field resonators, thermistors, heaters and multiple crystals to be mounted within the crystal package 10. For example, referring to FIG. 4, metallization bands 18c,18f may provide connection to the crystal 11 via electrodes 54, 55, metallization bands 18a,18d may be connected to a heating element 48 and metallization bands 18b,18e may provide frequency output from an oscillator and power to the oscillator, respectively.

Referring to FIG. 3, the housing 14 may be generally circular in shape and includes an opening 20 adjacent a first end 22 thereof. An outwardly extending flange 24 is preferably adjacent the opening 20. The second end 26 of the housing 14 is preferably enclosed and may form a flat disk. A peripheral wall 28 may be intermediate the first end 22 and second end 26 of the housing 14. The peripheral wall 28 is preferably minimal to provide a low profile crystal package 10.

A seal ring 15 is preferably engageable with the housing 14. The seal ring 15 may include an inward extending flange 30 adjacent a or first side 32 thereof and an outward extending flange 34 adjacent a or second side 36 thereof.

A peripheral wall 38 extends between the first end 32 and the second end 36 of the housing 14. The peripheral wall 38 preferably has a minimum thickness to provide a crystal package 10 of minimal size. In particular, the housing 14 and seal ring 15 are each approximately 0.06" from the first end to the second thereof in one embodiment of the crystal package 10 in accordance with the present invention. In addition, the ceramic base 12 and the ceramic top member 13 may be approximately 0.07" providing a crystal package 10 having a total height of approximately 0.19".

Alternatively, taller housings 14 may be utilized to accommodate thicker blanks and the crystal package 10 may be manufactured in a wide range of diameters and sizes to accommodate larger or smaller piezoelectric or electronic devices.

The housing 14 and seal ring 15 are preferably oxygen-free high conductivity (OFHC) copper in a cladding with KOVAR. The housing 14 and seal ring 15 may include 70% KOVAR (7 mils) and 30% OFHC copper (3 mils). The cladding may be plated with approximately 100–200 micro-inches of nickel and approximately 100–2000 micro-inches of gold. A barrier, such as chrome, is preferably provided between the nickel and gold plating. Plating the housing 14 and seal ring 15 with nickel and gold minimizes oxidation of the OFHC copper and provides excellent thermal conductivity for use in applications where fast warm-up is required (e.g., ovenized crystal oscillators). Further, OFHC copper provides an excellent material for sealing the housing 14 and the seal ring 15.

The first end 22 of the housing 14 and the second end 36 of the seal ring 15 may be joined to form a crystal chamber 17 for enclosing the resonator 11. In particular, the outward extending flange 24 of the housing 14 and the outward extending flange 34 of the seal ring 15 may be cold welded to form a hermetically sealed chamber for enclosing the crystal 20.

Preferably, the outward extending flange 24 of the housing 14 and the outward extending flange 34 of the seal ring 15 may be cold welded in an evacuated chamber at an applied pressure of approximately 80,000–100,000 psi at the weld joint. In addition, the cold welding is preferably performed in a vacuum at a temperature of about 200° C.–350° C. at the applied pressure for between 1½–5 minutes.

The ceramic base 12 of the crystal package 10 in accordance with the present invention includes a plurality of castillations 40 for solder joint inspections and receiving a plurality of metallization bands 18 configured to electrically couple the upper surface 19 and lower surface 21 of the ceramic base 12.

The metallization bands 18 are preferably formed of nickel-plated tungsten. Specifically, the metallization bands 18 may be 0.4 mils–0.9 mils tungsten and 80 micro-inches–160 micro-inches of nickel plating. The metallization bands 18 may include a plurality of portions. In particular, each metallization band may include a first portion 23 adjacent the upper surface 19 of the ceramic base 12, a second portion 25 adjacent the lower surface 21 of the ceramic base 12, and an intermediate portion 27 configured to engage the castillations 40 as shown in FIG. 3.

Figure 5:
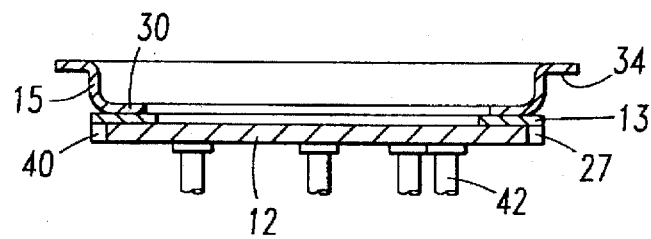
FIG. 5 is a cross-sectional view of the seal ring, ceramic top member, and ceramic base of the crystal package taken along line V—V as shown in FIG. 4.
Figure 4:
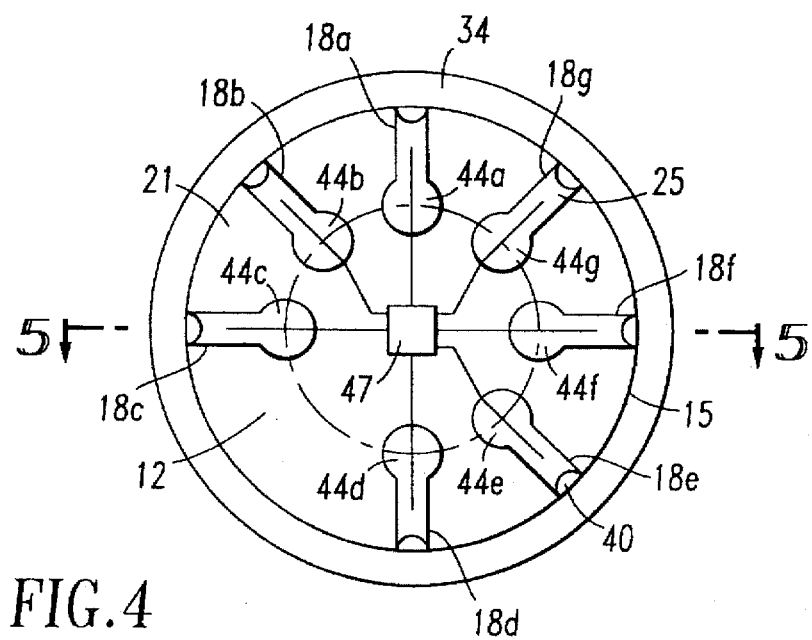
FIG. 4 is a bottom view of the crystal package shown in FIG. 3.

Referring to FIG. 4 and FIG. 5, a plurality of leads 42 may be brazed to the pads 44 which are attached to the second portion 25 of each metallization band 18. The leads 42 may be formed in a lead die. The formation of the leads will be done to optimize thermal gradients for resonator performance and for mechanical strength. Ground pad 44g preferably extends past the remaining pads 44a–44f towards the center of the ceramic base 12.

A bulk acoustic wave and lateral field terminal arrangement may be formed through the utilization of pads 44a–44c,44d,44f and leads 42 brazed thereto.

Figure 6:
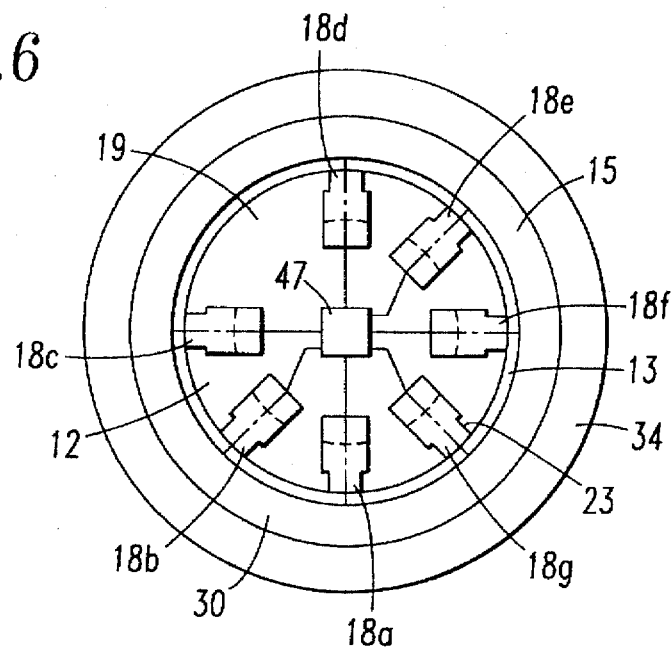
FIG. 6 is a top view of the seal ring, ceramic base and metallization bands of the crystal package.

Including seven electrical connections as shown in FIG. 4 and FIG. 6 permits additional components or connections to be made other then the standard bulk acoustic wave resonator with two connections.

In particular, an integrated circuit chip 47 may be attached to the ceramic base 12 to form an oscillator. In particular, the integrated circuit chip 47 is coupled with the metallization bands 18a–18g and may be mounted on the lower surface 21 of the ceramic base 12 as shown in FIG. 4. Alternatively, the integrated circuit chip 47 may be mounted within the crystal chamber 17 on the upper surface 19 of the ceramic base 12 as shown in FIG. 6.

Metallization band 18b may be coupled with the integrated circuit chip 47 to provide the output frequency from the oscillator. Voltage may be applied to the integrated circuit chip 47 via metallization band 18e. Alternatively, a thermistor may be coupled with metallization bands 18b, 18e for monitoring temperature of the resonator 11.

Metallization band 18g is ground and may be coupled with the seal ring 15. In particular, a tungsten deposit may be formed on metallization band 18g and ceramic top member 13 may have a corresponding hole permitting the tungsten deposit to engage the seal ring 15, thereby shunting the seal ring 15 and the metallization band 18g.

Referring to FIG. 5, the crystal package 10 additionally includes a ceramic top member 13 which can be cofired with the ceramic base 12 having the metallization bands 18 therein to form a unitary base without feedthrus. Confiring the ceramic base 12 and ceramic top member 13 with the metallization bands 18 therein in accordance with the present invention provides an ultra low leak rate crystal package 10. Specifically, the leak rate of the crystal package 10 has been measured to be less than $5 \times 10^{-12}$ ccHe/sec.

The ceramic base 12 and ceramic top member 13 are preferably alumina (92% $Al_2O_3$), but other alternative ceramic materials may be utilized for specialized applications. For example, boron nitride provides a crystal package 10 with improved thermal performance.

A brazing compound 16 may be placed on the ceramic top member 13 to permit brazing of the seal ring 15 and ceramic top member 13, each having different thermal coefficients of expansion.

A plurality of ribbon bands 50 are shown in FIG. 3. Each of the ribbon bands 50 may be welded at a first end 51 thereof to the first portion 23 of a respective metallization band 18 for electrically coupling the metallization bands 18a,18c,18d,18f with ribbon bands 50 and the resonator 11.

The ribbon bands 50 and the respective metallization bands 18 may be bonded using parallel-gap welding techniques or ultrasonic welding techniques. The first portion 23 of each metallization band 18 is best shown in FIG. 6.

Figure 7:
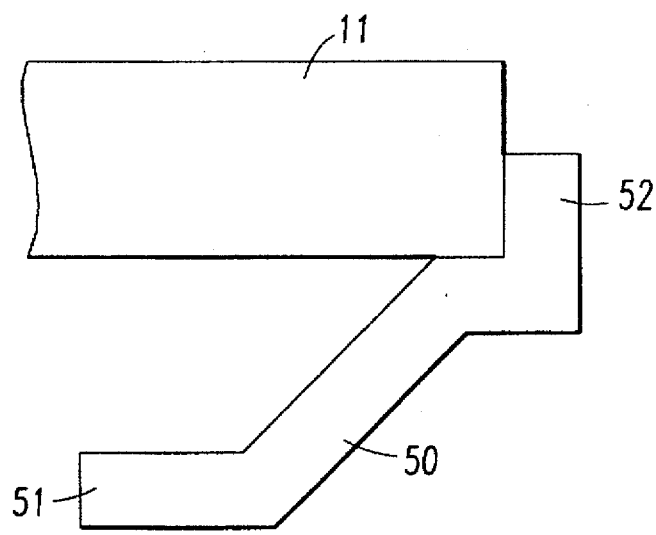
FIG. 7 is a side view of the ribbon bands within the sealed crystal chamber of the crystal package.

The ribbon bands 50 are shown in detail in FIG. 7. The second end of each ribbon band 50 preferably forms a ledge 52. The resonator 11 may be supported by the ledges 52 of each ribbon band 50 within the crystal package 10. Each ribbon band 50 may be bonded to the crystal 11 through spot welding at the point of contact thereof.

The spot welding may be performed utilizing standard Unitek spot welding equipment bearing Product No. 1-048-02 with appropriately sized tips. Parallel gap welding is done using Ni, Cu or Fe based alloys. The weight used in welding is between 2 and 1000 grams. The voltage is between 0.2 and 5 volts, and the duration is between 0.2 and 80 milliseconds.

Figure 8:
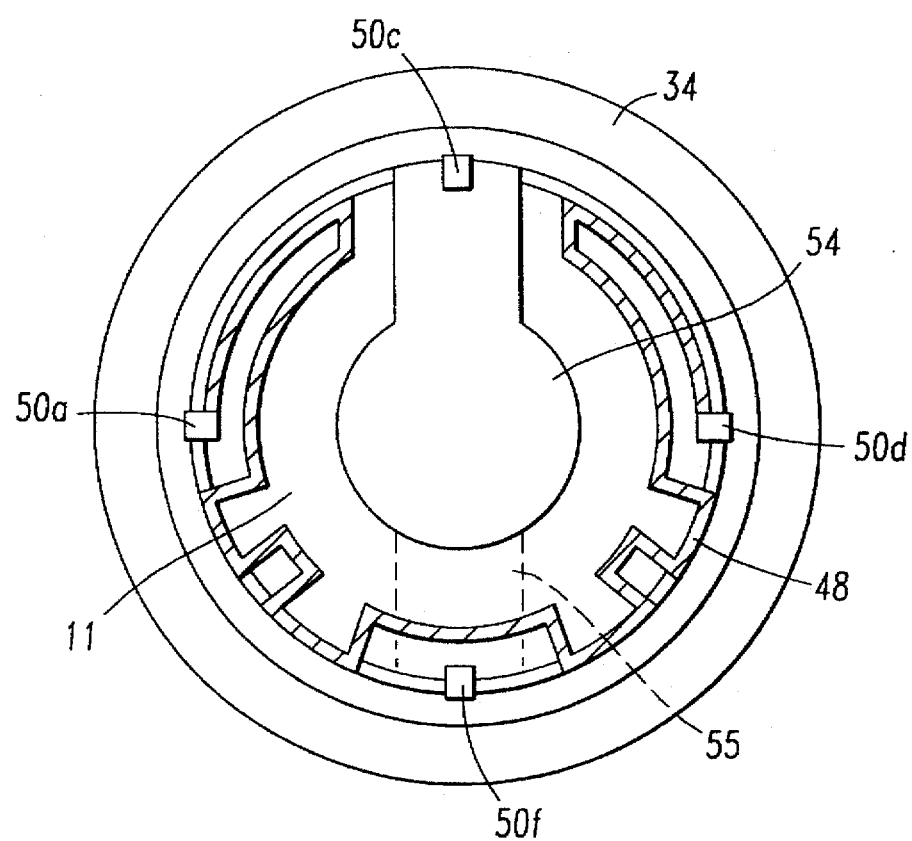
FIG. 8 is a top view of a resonator within the crystal package.

A heating element 48 attached to the resonator 11 is shown in FIG. 8. The heating element 48 maintains the resonator 11 at a constant temperature for providing constant frequency. The embodiment of the resonator 11 shown in FIG. 8 is a bulk wave resonator and includes a first electrode 54 coupled with ribbon band 50a adjacent a top surface of the resonator 11. A second electrode 55 (indicated by broken lines in FIG. 8) is adjacent the bottom surface of the resonator 11 and is coupled with ribbon band 50f. Alternatively, a lateral field resonator 11 may be formed by providing both electrodes adjacent the same surface of the resonator 11.

Referring to FIG. 8, the heating element 48 is coupled with ribbon bands 50a,50d. A voltage may be applied to the heating element 48 via metallization bands 18a,18d and corresponding ribbon bands 50a,50d.

While preferred embodiments of the invention have been shown and described herein, it will be appreciated by those skilled in the art that various modifications and alternatives to the disclosed embodiments may be developed in light of the overall teachings of the disclosure. Accordingly, the disclosed embodiments are meant to be illustrative only and not limiting to the scope of the invention which is to be given the full breadth of the following claims and all equivalents thereof.

We claim:

1. A package for holding a crystal, comprising:

a. a base having an upper surface and a lower surface;

b. a plurality of metallization bands each having a first portion adjacent the upper surface of the base and a second portion adjacent the lower surface of the base and an intermediate portion adjacent the perimeter of the base for electrically coupling the first portion thereof and the second portion thereof;

c. a top member attached to the upper surface of the base and the base and the top member seal the first portion of each of the metallization bands therein;

d. a seal ring having a first side and a second side and the first side thereof engaging with the top member;

e. a housing having a first end and an enclosed second end and the first end of the housing engaging with the second side of the seal ring to define a sealed crystal chamber; and f. a plurality of ribbon bands each for electrically coupling a respective one of the metallization bands with the crystal.

2. The package of claim 1 wherein the base and top member are ceramic.

3. The package of claim 1 further comprising a brazing compound intermediate the top member and the seal ring.

4. The package of claim 1 wherein the perimeter of the base includes a plurality of castillations each for receiving a respective one of the intermediate portions of the metallization bands.

5. The package of claim 1 wherein the base and top member are alumina.

6. The package of claim 1 wherein the base and top member are boron-nitride.

7. The package of claim 1 further comprising a plurality of leads each connected with a respective one of the second portions of the metallization bands.

8. The package of claim 1 wherein the housing and seal ring are joined together by cold welding.

9. The package of claim 1 wherein the base and top member are cofired.

10. The package of claim 1 wherein the housing and seal ring are gold plated.

11. The package of claim 1 wherein the metallization bands are nickel plated tungsten.

12. The package of claim 1 further comprising an integrated circuit chip mounted on the base for providing an oscillator.

13. The package of claim 1 further comprising a heating element mounted on the crystal for providing temperature stability.

14. The package of claim 2 further comprising a brazing compound intermediate the top member and the seal ring.

15. The package of claim 2 further comprising an integrated circuit chip mounted on the base for providing an oscillator.

16. The package of claim 2 further comprising a heating element mounted on the crystal for providing temperature stability.

17. The package of claim 14 wherein the housing and seal ring are joined together by cold welding.

18. The package of claim 17 wherein the base and top member are cofired.

19. The package of claim 18 wherein the perimeter of the base includes a plurality of castillations each for receiving a respective one of the intermediate portions of the metallization bands.

20. The package of claim 19 wherein the base and top member are one of alumina and boron-nitride.

21. The package of claim 20 further comprising a plurality of leads each connected with a respective one of the second portions of the metallization bands.

22. The package of claim 21 further comprising an integrated circuit chip mounted on the base for providing an oscillator.

23. The package of claim 21 further comprising a heating element mounted on the crystal for providing temperature stability.

* * * * *